(12) United States Patent
Azimi et al.

(10) Patent No.: US 7,199,651 B2
(45) Date of Patent: Apr. 3, 2007

(54) FREQUENCY SELECTION USING CAPACITANCE MULTIPLICATION

(75) Inventors: Kouros Azimi, Center Valley, PA (US); Thaddeus John Gabara, Murray Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/990,368

(22) Filed: Nov. 18, 2004

(65) Prior Publication Data

US 2006/0103456 A1 May 18, 2006

(51) Int. Cl.
*H03B 1/00* (2006.01)

(52) U.S. Cl. ........................ 327/552; 327/156; 327/147

(58) Field of Classification Search ................ 327/589, 327/390, 536, 156, 147, 552
See application file for complete search history.

(56) References Cited

U.S. PATENT DOCUMENTS

| 5,396,195 A | 3/1995 | Gabara |
| 5,652,537 A * | 7/1997 | Fleeman ..................... 327/358 |
| 6,344,772 B1 | 2/2002 | Larsson |

* cited by examiner

*Primary Examiner*—Dinh T. Le

(57) ABSTRACT

A variable capacitance circuit on an integrated circuit comprises a MOS transistor, and a capacitance multiplier connected to one end of a channel of the MOS device. A MOS device is formed in series with an inductance, and a capacitance multiplier is formed to be connected to a node between the MOS device and the inductance.

10 Claims, 4 Drawing Sheets

PRIOR ART
LC VCO WITH
BANK SWITCHING

FREQUENCY SELECTION USING CAPACITANCE MULTIPLICATION

BACKGROUND OF THE INVENTION

1. Field of the Invention

This invention relates to integrated circuits. More particularly, it relates to an integrated circuit having variable frequency selection.

2. Background of Related Art

Integrated Circuit (IC) designers are often challenged to reduce costs. At the same time, designers are challenged to increase performance of various circuit blocks on their ICs, and of course to decrease size of the IC.

Analog circuit designers in particular are faced with achieving better circuit performance in standard digital complementary metal-oxide semiconductor (CMOS) processes. Many analog blocks require implementation of capacitors, which typically occupy larger areas of space in the IC as compared to other elements. It is known that a capacitor, or perhaps more correctly that capacitance, may be formed on an IC using a metal-oxide semiconductor (MOS) process. A MOS capacitor is, in reality, a MOS transistor connected in a given configuration such that it behaves like a discrete capacitor.

Many circuit designs use matched capacitors. Thus, a particular analog block in an IC design requires the implementation of multiple capacitors, with the frequency exhibited by the individual capacitors matched as precisely as possible.

As an example, FIG. 3 shows a conventional LC voltage controlled oscillator (VCO) circuit having a fixed frequency of oscillation using matched capacitors C10 and C20.

In particular, as shown in FIG. 3, cross-coupled MOS transistors T1, T2 form the active portion of the voltage controlled oscillator (VCO) circuit. An inductor L1 is in series with a first MOS capacitor device T2 between power and ground, and a second inductor L2 is in series with a second MOS capacitor device T1 between power and ground.

To set the frequency of operation of the VCO circuit, one end of a fixed capacitor C10 is connected to the gate of the MOS transistor T1, and the other to ground, and similarly one end of another fixed capacitor C20 is connected to the gate of the MOS transistor T2, and the other end to ground.

The precise matching of the frequency of oscillation of the two matched LC circuits is dependent upon the accuracy of capacitance of the discrete capacitors C10, C20. The closer in actual capacitance they are to one another, the closer the frequency match.

In many applications, MOS capacitors are used for C10 and C20. Ideally, these MOS capacitor devices are matched to exhibit identical capacitance to one another. However, a limited range of linear operation of MOS capacitors makes the task of matching capacitance between two separate MOS capacitors inanely difficult, in large part because conventional MOS capacitors have a limited range of linear operation and frequency. Thus, post-manufacture adjustment of the capacitance of MOS capacitor devices becomes very limited in a range that's linear.

As a result, MOS capacitors have limited use in a variable capacitance design, without complicated accommodation for the non-linearity of the capacitance due to the limited range of linear operation and frequency of such devices. Therefore, preferably matched MOS capacitors are manufactured to have capacitances within very tight tolerances of one another, adding further to manufacturing costs. Also, device drop out will increase, meaning that more devices will be discarded because of too-large a mis-match in capacitance between the MOS capacitors that are intended to be matched. Higher device drop outs adds again to the cost of manufacture.

One technique for adjusting the frequency of operation of an LC VCO is to selectively connect one or more capacitors to the node between a respective MOS transistor and an inductor in series therewith.

For instance, as shown in FIG. 4, a conventional LC voltage controlled oscillator (VCO) circuit including matched MOS transistors and a bank of capacitors may be selectively switched in to provide multiple discrete frequencies of operation of the LC VCO.

In particular, as shown in FIG. 4, a series of discrete capacitors C1, C2, C3 may be selectively switched in to connect to the gate of one MOS transistor T1, while similar discrete capacitors C4, C5, C6 may be selectively switched in to connect to the gate of the other MOS transistor T2. In addition to individual capacitance values, multiple capacitors may be switched together in parallel to provide additive discrete capacitance.

While the circuit of FIG. 4 does allow adjustment of the frequency of operation, the adjustments are discrete. Moreover, for large values of LC, large capacitors are required. To some extent, the larger the necessary capacitance, the larger the device must be, again occupying valuable space and working against the need for smaller and more efficient devices, and even limiting the miniaturization thereof.

There is a need for an improved design and technique for implementing capacitor devices having improved range of linearity, particularly in designs that require matched capacitors, thus achieving smaller and less expensive IC designs.

SUMMARY OF THE INVENTION

In accordance with the principles of the present invention, a variable capacitance circuit on an integrated circuit comprises a cross coupled MOS transistor pair, and a capacitance multiplier connected to one end of a channel of the MOS device.

A capacitance multiplier is formed to be connected to a node between the MOS device and the inductance.

BRIEF DESCRIPTION OF THE DRAWINGS

Features and advantages of the present invention will become apparent to those skilled in the art from the following description with reference to the drawings, in which.

DETAILED DESCRIPTION OF THE ILLUSTRATIVE EMBODIMENTS

In accordance with the principles of the present invention, a capacitance multiplier circuit provides large values of capacitance using small valued capacitors. Moreover, such a VCO including a capacitance multiplier circuit uses less silicon area than otherwise conventional variable frequency devices.

Figure 1:
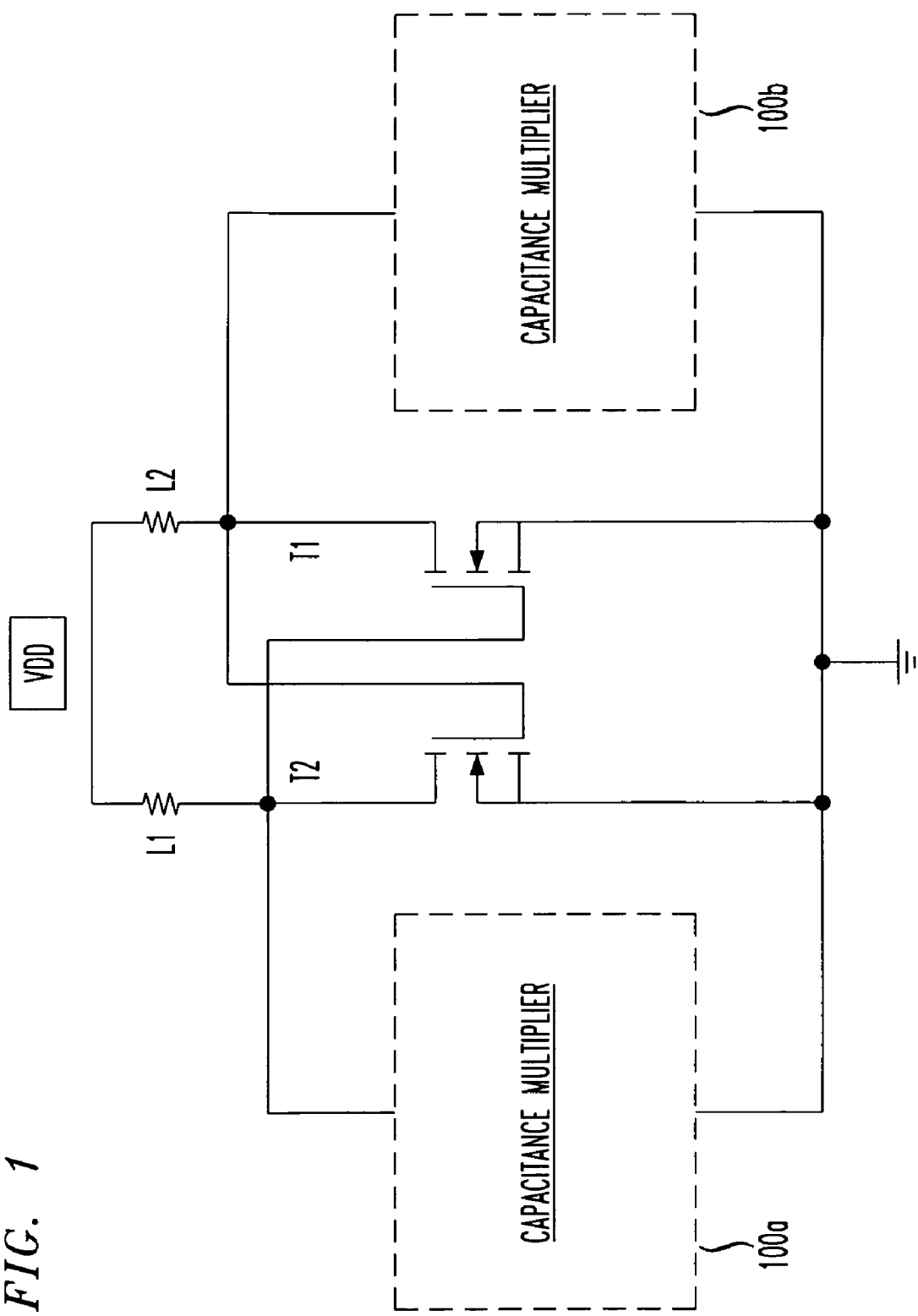
FIG. 1 shows an LC voltage controlled oscillator (VCO) circuit with frequency setting capacitors each being capacitance multiplied by a respective capacitance multiplier, in accordance with the principles of the present invention.

FIG. 1 shows two matched MOS capacitor devices, each being capacitance multiplied by a respective capacitance multiplier, in accordance with the principles of the present invention.

In particular, as shown in FIG. 1, cross-coupled MOS devices T1, T2 are matched to have identical characteristics. An inductor L1 is in series with a first MOS transistor device T2 between power and ground, and a second inductor L2 is in series with a second MOS transistor device T1 between power and ground.

Importantly, in the circuit of FIG. 1, capacitance multipliers 100a and 100b (collectively referred to by the reference designator 100) are implemented to both provide adjustment of the capacitance as well as to provide large amounts of capacitance using smaller discrete capacitors within a capacitance multiplier circuit.

The capacitance multipliers 100a, 100b are connected to the gates of the MOS capacitor devices T1, T2. To set the frequency of operation of the MOS VCO circuit, one end of a capacitance multiplier circuit 100a is connected to the gate of the transistor T1, and the other end to ground. Similarly, to set the frequency of operation of the MOS VCO circuit, one end of a capacitance multiplier circuit 100b is connected to the gate of the MOS capacitor device T2, and the other end to ground.

Unit capacitance multiplier cells 100 are thus fabricated and replicated as necessary within an integrated circuit (IC), and multiple instances are placed in an optimum configuration so as to save area and provide suitable device matching.

The particular capacitance multiplier circuit 100 may be that which is disclosed in U.S. Pat. No. 6,344,772 to Larsson, the entirety of which is expressly incorporated herein by reference.

Figure 2:
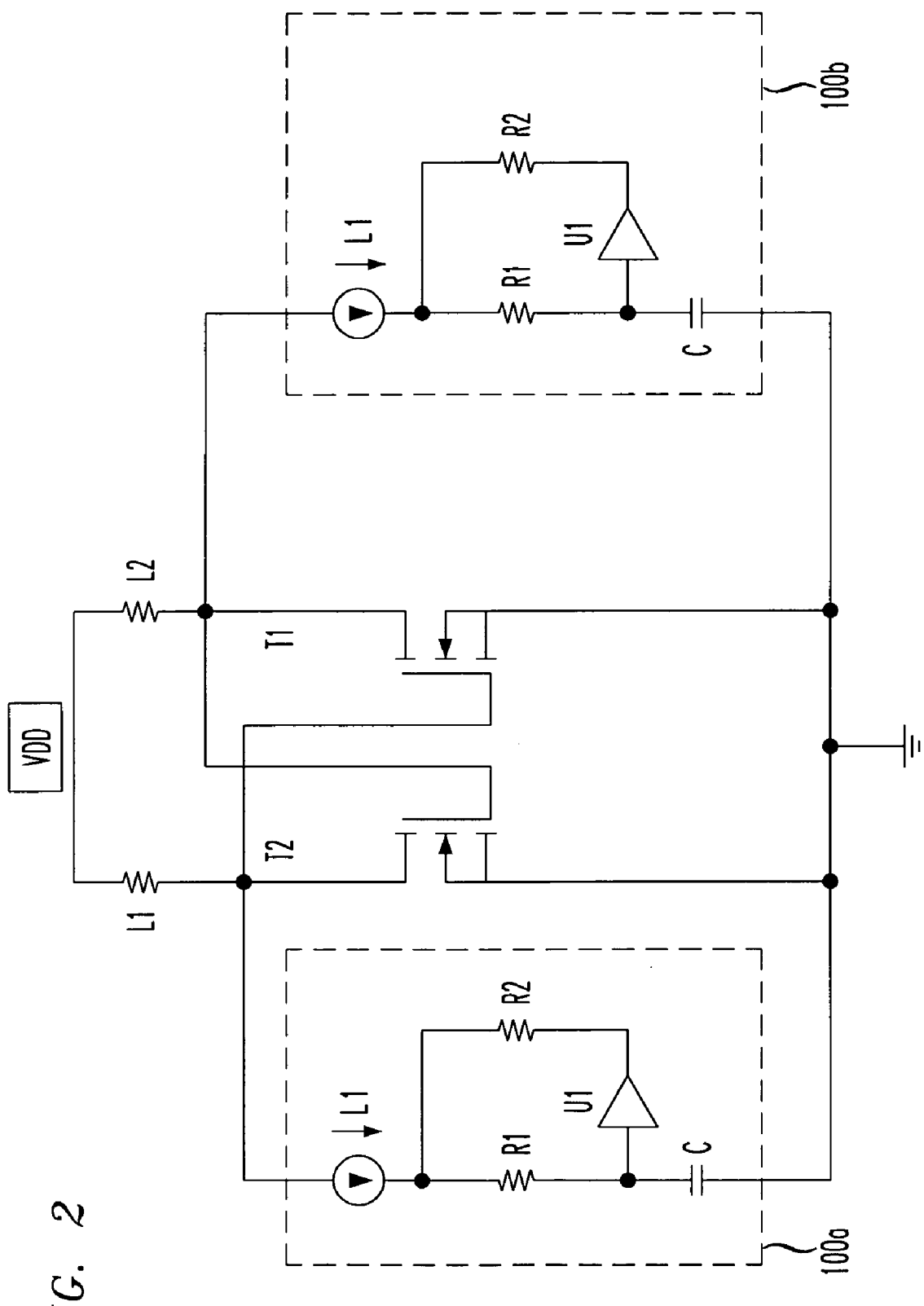
FIG. 2 shows details of the capacitance multipliers in the LC voltage controlled oscillator (VCO) circuit shown in FIG. 1.
Figure 3:
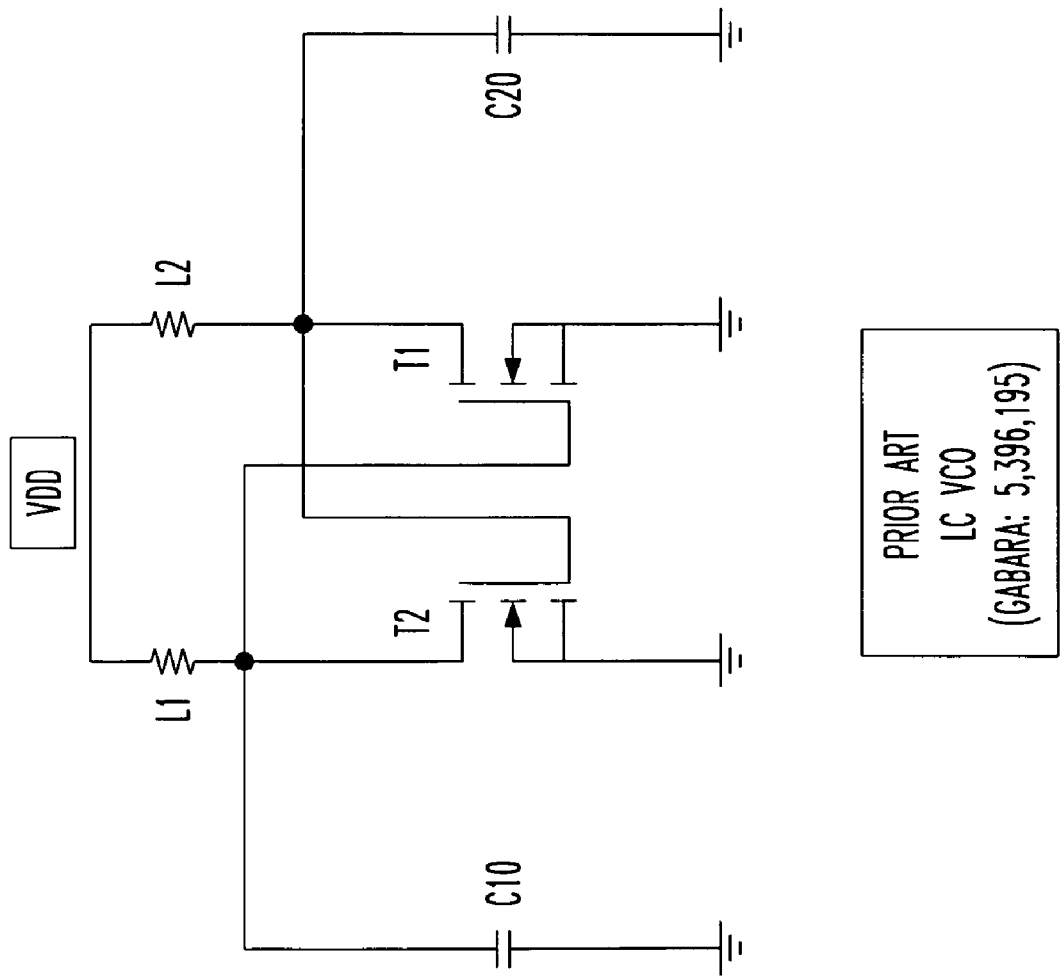
FIG. 3 shows a conventional LC voltage controlled oscillator (VCO) circuit having a fixed frequency of oscillation using matched capacitor devices C10 and C20.
Figure 4:
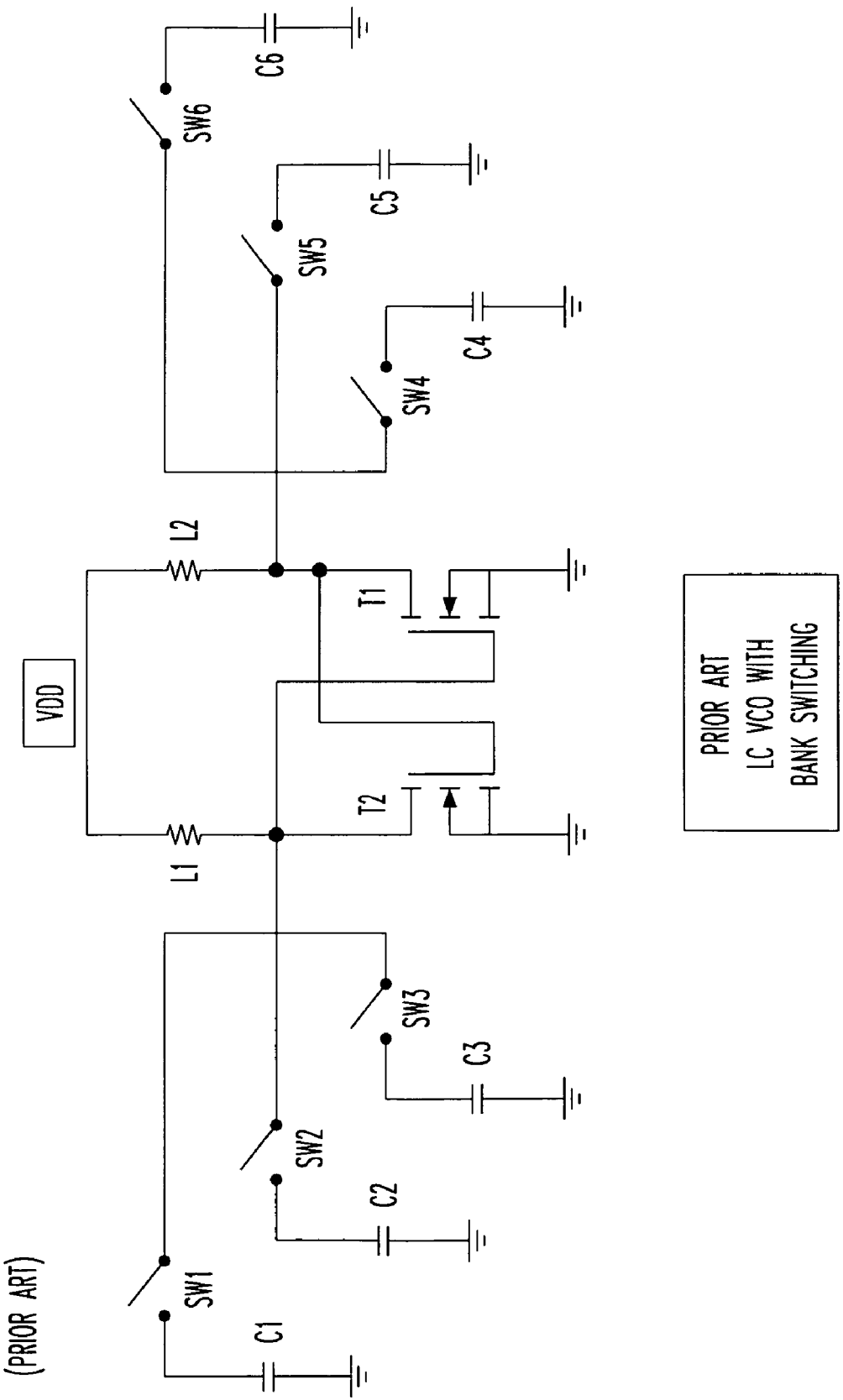
FIG. 4 shows a conventional LC voltage controlled oscillator (VCO) circuit including a bank of capacitors that may be selectively switched in to provide multiple discrete frequencies of operation of the LC VCO.

FIG. 2 shows details of the capacitance multipliers in the VCO circuit shown in FIG. 1.

In particular, as shown in FIG. 2, each capacitance multiplier circuit 100a, 100b is identical. Using capacitance multiplier circuits or networks within a VCO, large values of capacitance can be realized using small valued capacitors.

The capacitance multipliers 100a, 100b include a first resistor R1 connected between a first node and an intermediate node. A capacitor C1 is connected between the intermediate node and a point of reference potential. A unity gain amplifier has an input connected to the intermediate node and its output connected via a second resistor R2 to the first node.

The unity gain amplifier ensures that the voltage drop across the second resistor is equal to the voltage drop across the first resistor. The effective capacitance Ce of the network is equal to the capacitor C1 times (R1+R2)/R2. Accordingly, it follows that the effective capacitance Ce can be changed by varying the resistance values of R1 and/or R2. By making R1 larger than R2, the effective capacitance Ce can even be made to be much larger than the capacitance of the capacitor C1.

The present invention provides IC capacitors that use less silicon area as was otherwise conventionally required, and provides better and easier matching between separate capacitor devices. Such capacitors have particular use, e.g., with oscillator blocks in an IC design that utilize capacitor elements connected to current sources and amplifiers, to form a capacitance multiplier circuit.

While the invention has been described with reference to the exemplary embodiments thereof, those skilled in the art will be able to make various modifications to the described embodiments of the invention without departing from the true spirit and scope of the invention.

What is claimed is:

1. A variable capacitance circuit on an integrated circuit, said variable capacitance circuit comprising:
   a cross-coupled MOS transistor pair comprising a first MOS transistor cross-coupled to a second MOS transistor;
   a first adjustable capacitance multiplier connected to one end of a channel of said first MOS transistor of said cross-coupled MOS transistor pair; and
   a second adjustable capacitance multiplier connected to one end of a channel of said second MOS transistor of said cross-coupled MOS transistor pair.

2. The variable capacitance circuit on an integrated circuit according to claim 1, wherein said capacitance circuit further comprises:
   an inductor connected to said one end of said channel of said first MOS transistor.

3. The variable capacitance circuit on an integrated circuit according to claim 1, wherein said first capacitance multiplier comprises:
   a first resistor connected between a first node and a gate of said channel of said first MOS transistor;
   a first capacitor connected between said first resistor and a point of reference potential;
   a unity gain amplifier having an input connected to said first resistor, and having an output; and
   a second resistor connected between said first node and said output of said unity gain amplifier.

4. The variable capacitance circuit on an integrated circuit according to claim 1, wherein:
   said first variable capacitance multiplier and said second variable capacitance multiplier operate to matched an effective capacitance of capacitors in parallel to one another.

5. A method of forming a variable capacitor in an integrated circuit, said method comprising:
   forming in said integrated circuit a cross-coupled MOS transistor pair in series with an inductance, said cross-coupled MOS transistor pair comprising a first MOS transistor cross-coupled to a second MOS transistor; and
   forming an adjustable capacitance multiplier connected to a node between said first MOS transistor and said inductance.

6. The method of forming a variable capacitor in an integrated circuit according to claim 5, wherein said forming said variable capacitance multiplier comprises:
   forming a first resistor connected between a first node and a gate of said channel of first one of said MOS transistor pair;
   forming a first capacitor connected between said first resistor and a point of reference potential;
   forming a unity gain amplifier having an input connected to said first resistor, and having an output; and
   forming a second resistor connected between said first node and said output of said unity gain amplifier.

7. The method of forming a variable capacitor in an integrated circuit according to claim 5, further comprising:
  forming another variable capacitance multiplier connected to one end of a channel of a second one of said MOS transistor pair;
  wherein said first variable capacitance multiplier and said second variable capacitance multiplier operate to match an effective capacitance of capacitors in parallel to one another.

8. Apparatus for forming a variable capacitor in an integrated circuit, comprising:
  cross-coupled MOS transistor means comprising a first MOS transistor cross-coupled to a second MOS transistor, formed in said integrated circuit, said cross-coupled MOS transistor means being in series with an inductance; and
  adjustable capacitance multiplier means, connected to a node between said first transistor and said inductance.

9. The apparatus for forming a variable capacitor in an integrated circuit according to claim 8, wherein said variable capacitance multiplier means comprises:
  first resistor means, connected between a first node and said one end of said channel of first one of said MOS transistor pair;
  first capacitor means, connected between said one end of said channel of said first one of said MOS transistor pair and a point of reference potential;
  unity gain amplifier means, said unity gain amplifier means having an input connected to said one end of said channel of said first one of said MOS transistor pair, and having an output; and
  second resistor means, connected between said first node and said output of said unity gain amplifier means.

10. The apparatus for forming a variable capacitor in an integrated circuit according to claim 8, further comprising:
  another variable capacitance multiplier means, connected to one end of a channel of a second one of said MOS transistor means;
  wherein said first variable capacitance multiplier means and said second variable capacitance multiplier means operate to match an effective capacitance of capacitors in parallel to one another.

* * * * *